United States Patent
Chung et al.

[11] Patent Number: 5,202,279
[45] Date of Patent: Apr. 13, 1993

[54] POLY SIDEWALL PROCESS TO REDUCE GATED DIODE LEAKAGE

[75] Inventors: Gishi Chung, Garland; William R. McKee; Clarence W. Teng, both of Plano, all of Tex.

[73] Assignee: Texas Instruments Incorporated, Dallas, Tex.

[21] Appl. No.: 622,465

[22] Filed: Dec. 5, 1990

[51] Int. Cl.$^5$ ............... H01L 21/302; H01L 21/311; H01L 21/70

[52] U.S. Cl. ........................... 437/47; 437/48; 437/52

[58] Field of Search ............... 437/47, 48, 52; 357/23.6

[56] References Cited

U.S. PATENT DOCUMENTS 4,794,563 12/1988 Maeda .................. 357/23.6
5,077,232 12/1991 Kim et al. ............... 437/47

FOREIGN PATENT DOCUMENTS 63-148674 6/1988 Japan ..................... 437/52
1-192163 8/1989 Japan ..................... 437/48
2-116160 4/1990 Japan ..................... 437/52

Primary Examiner—Olik Chaudhuri
Assistant Examiner—Ourmazd S. Ojan
Attorney, Agent, or Firm—Robby T. Holland; Gary Honeycutt; Bill Hiller

[57] ABSTRACT

A method of reducing gated diode leakage in trench capacitor type field plate isolated dynamic random access memory devices is disclosed. Trenches are etched into a face of a body of semiconductor material. Storage nodes surrounding the trenches are created. A polysilicon layer is formed on the trench walls. A storage dielectric layer is formed on the trench walls, adjacent to the layer of polysilicon on the trench walls, so that the layer of polysilicon on the trench walls lies between the storage dielectric layer and the storage node. The layer of polysilicon on the trench walls reduces leakage current from the storage node. A trench type field plate isolated random access memory cell structure is also disclosed.

8 Claims, 10 Drawing Sheets

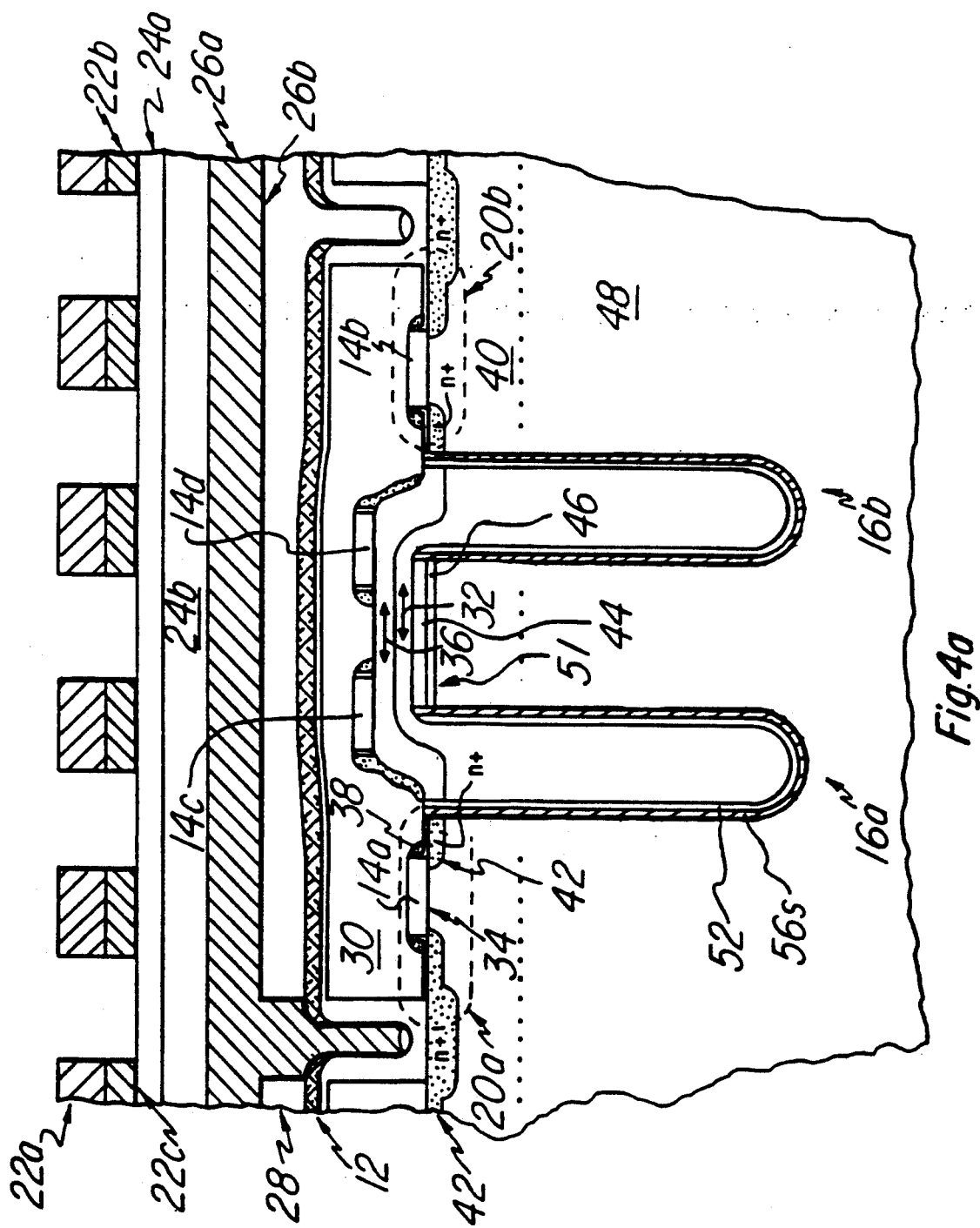

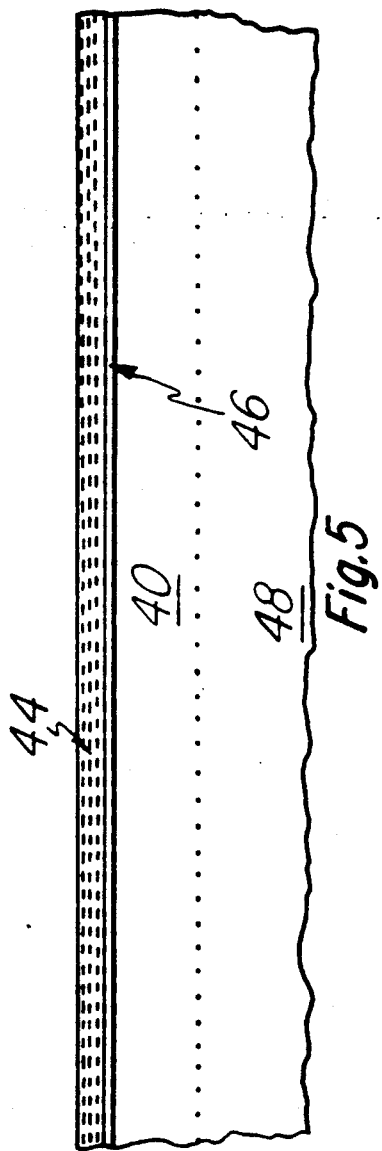
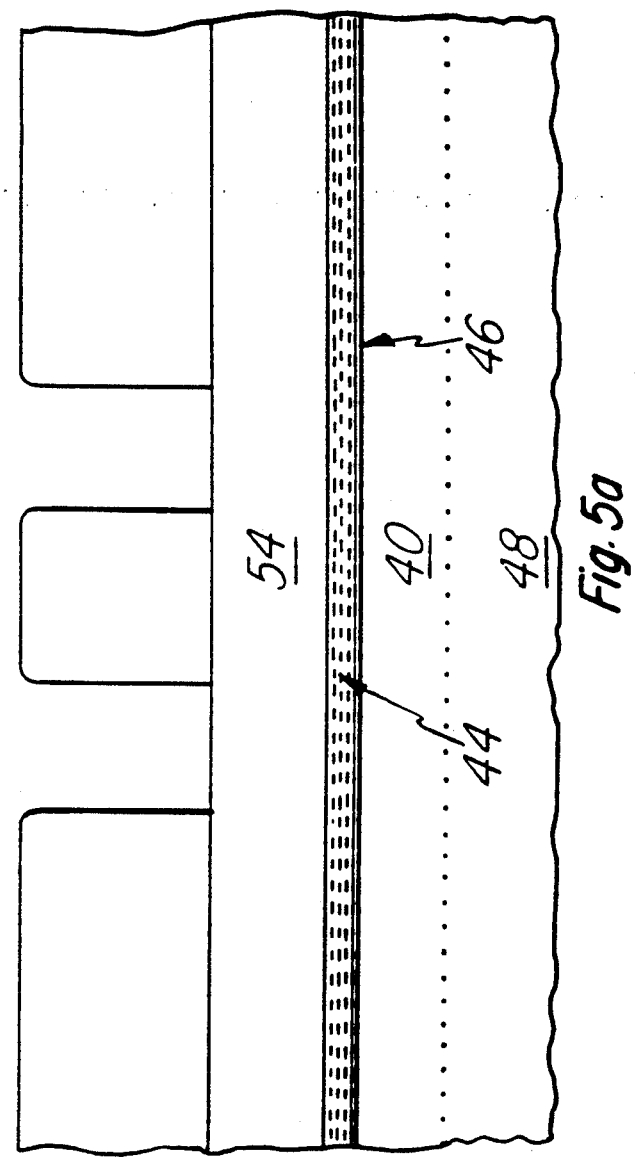

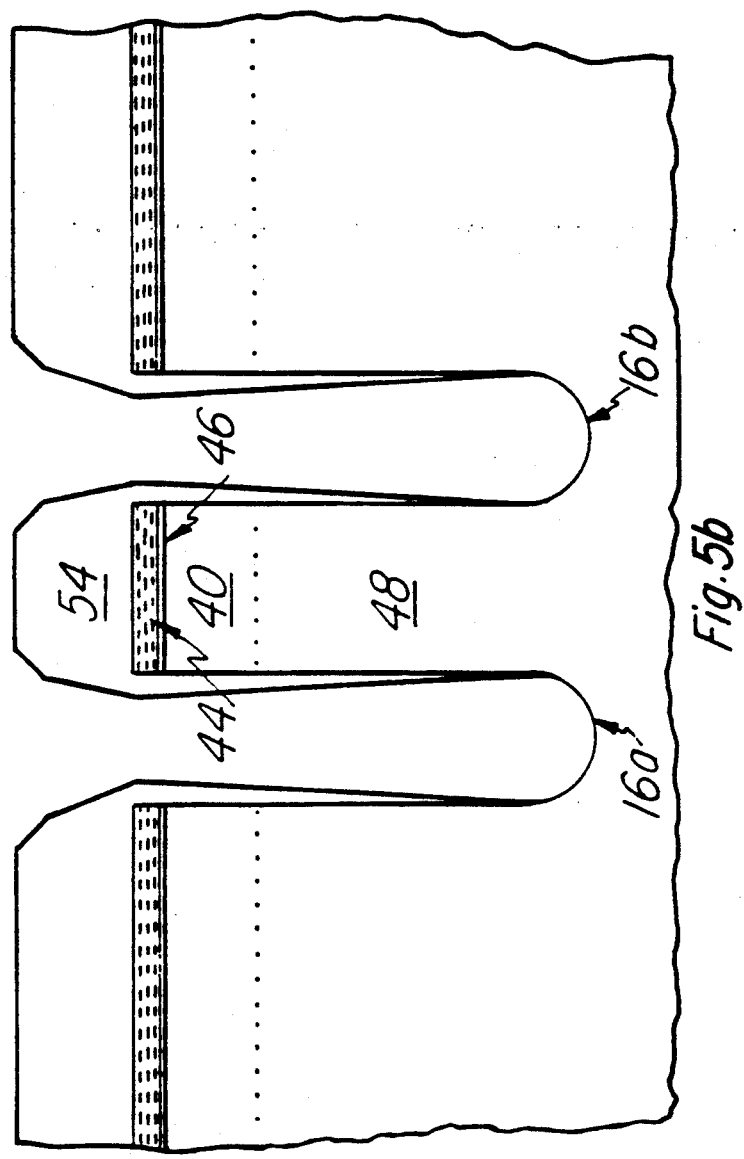

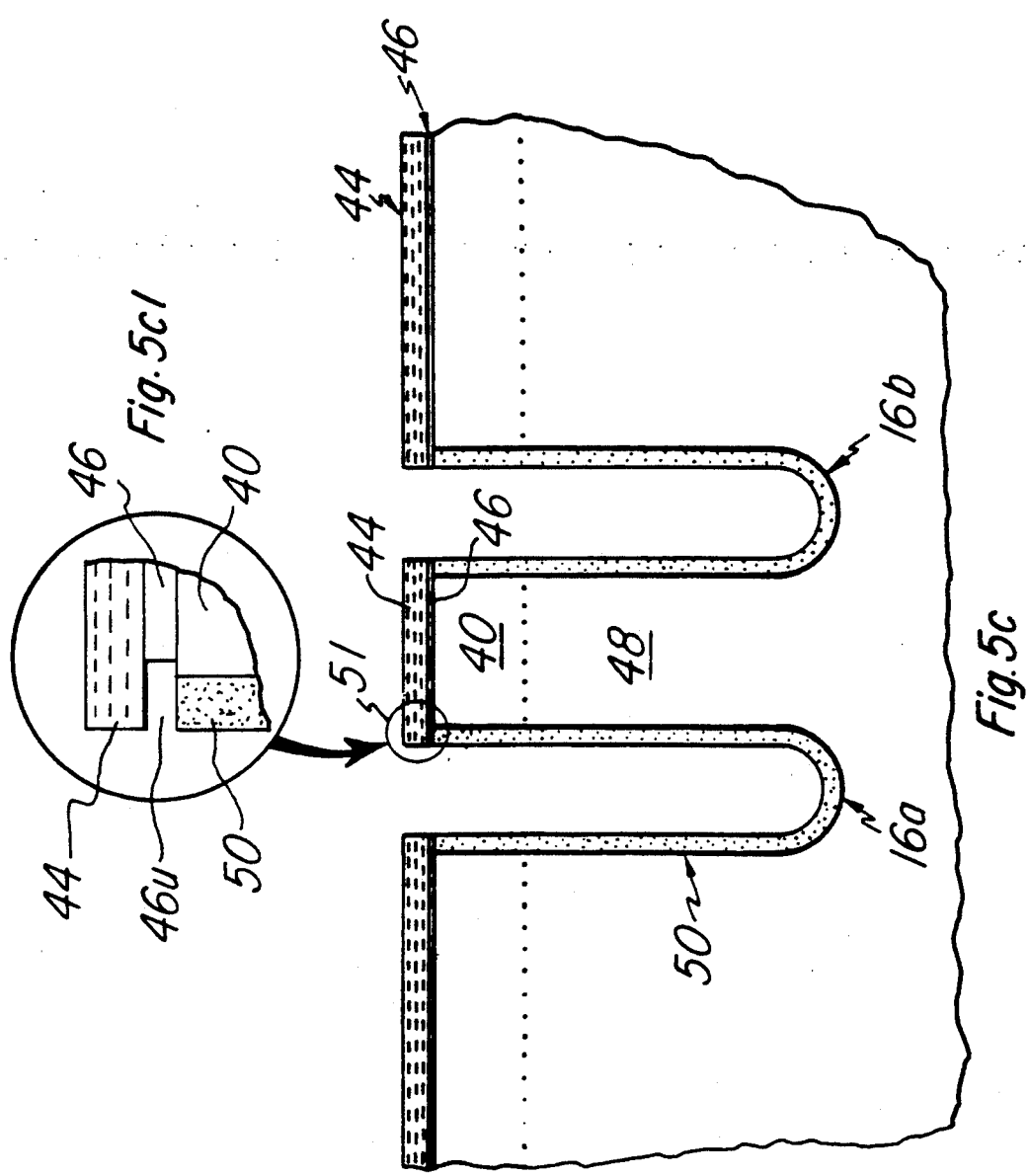

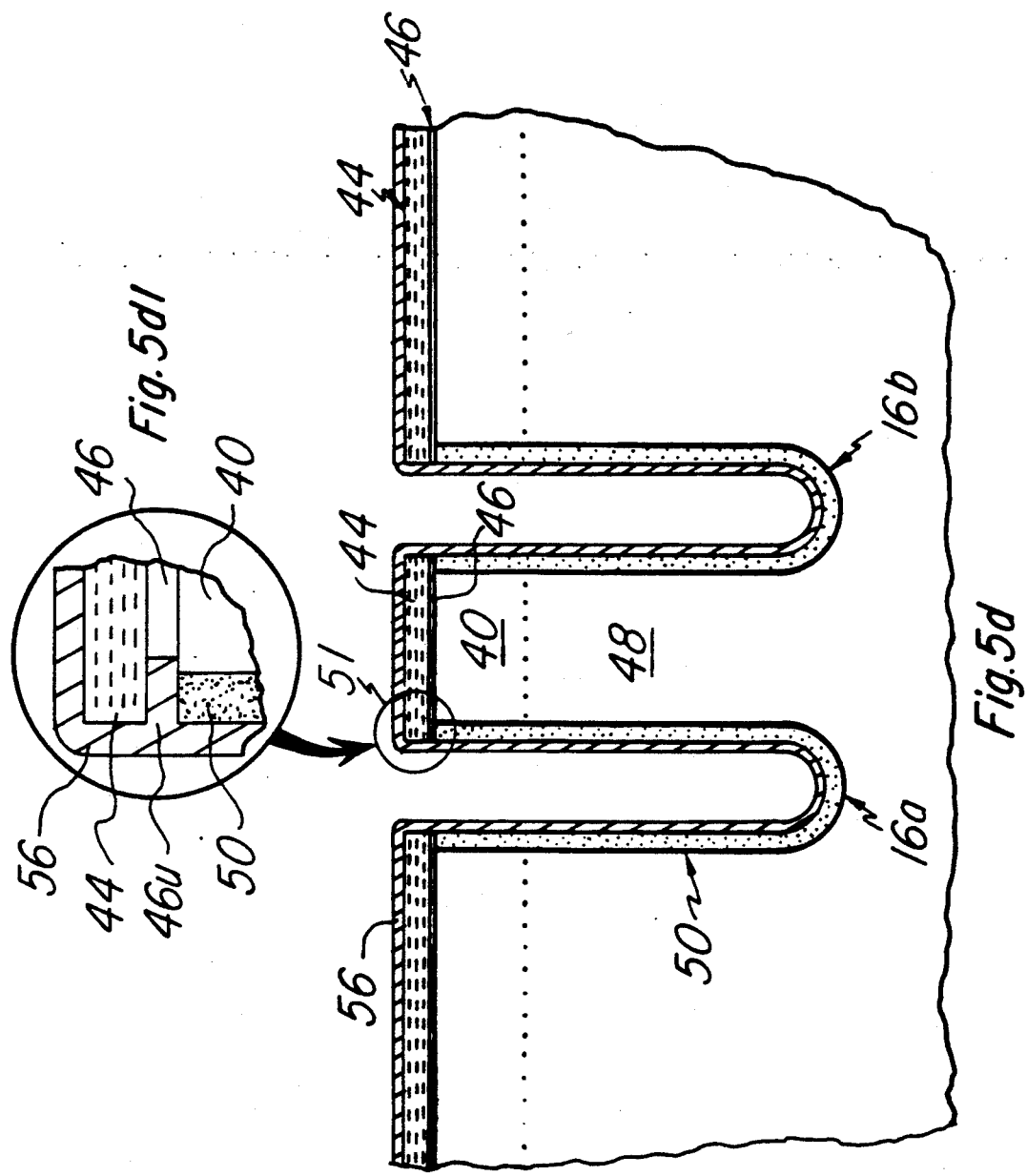

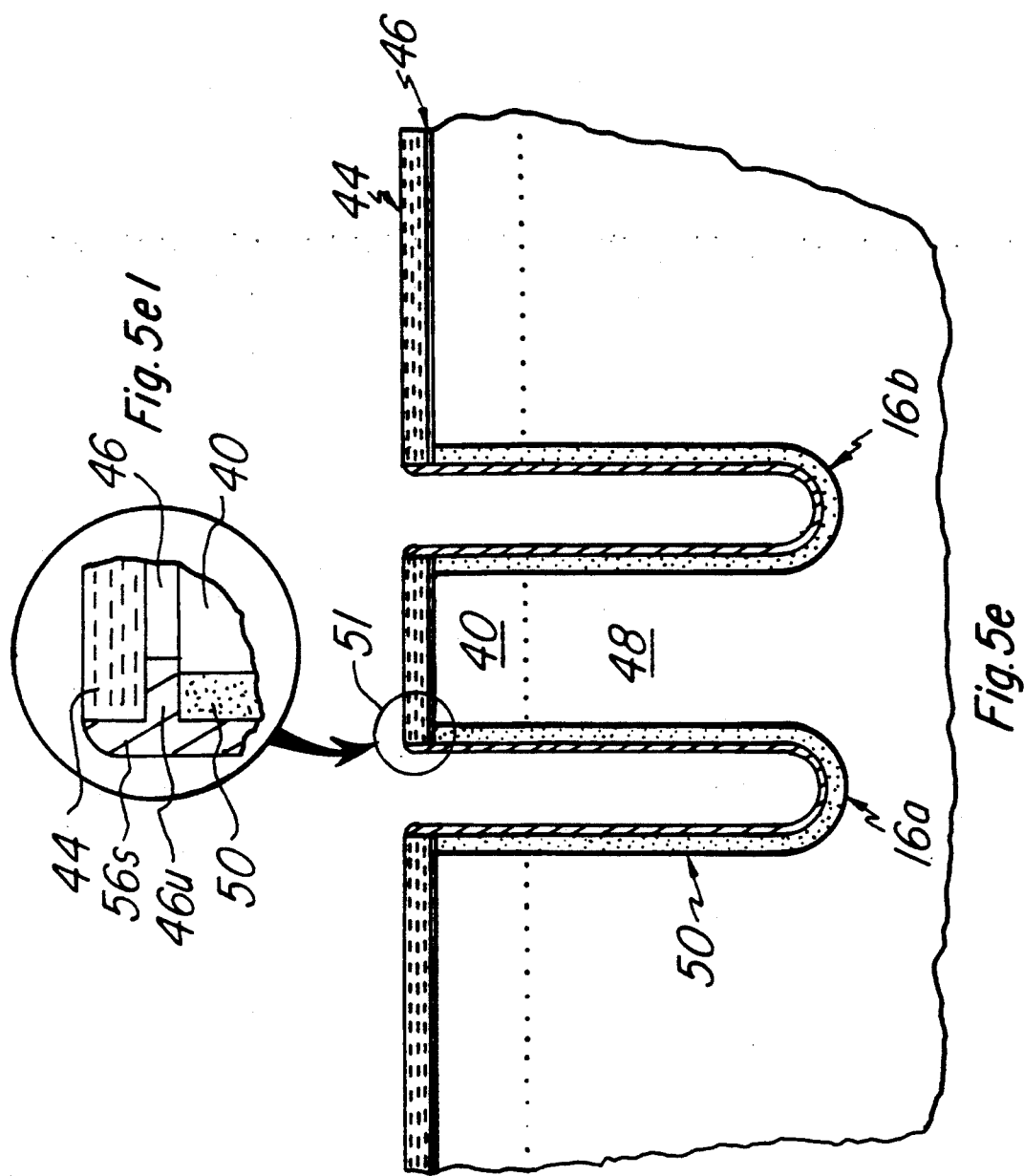

POLY SIDEWALL PROCESS TO REDUCE GATED DIODE LEAKAGE

FIELD OF THE INVENTION

The present invention relates to the field of integrated circuits and more specifically to integrated circuit memory devices having trench type capacitors.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for 16M DRAMs of submicron technology now exist r and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al. (a trench capacitor cell). In a trench capacitor cell device, the capacitance of the device is increased by etching a groove, or trench, in the capacitance region. The trench capacitor cell of Baglee describes it's upper plate as a polysilicon layer extending into the trench. This polysilicon layer extends over the face of the silicon bar to form field plate isolation over the face of the bar.

In developing DRAMs of the trench capacitor type, process engineers have observed a problem near the top of the trench they describe as "Gated Diode Leakage". This problem manifest itself through a leakage current. Current may flow through the upper portion of the storage node on the top of the trench wall edge into the silicon substrate by a band to band tunneling effect, thereby reducing the charge placed upon the storage node.

It is the object of this invention to provide a method to eliminate undesirable gated diode leakage near the top of the trench for trench capacitor type devices such as high density dynamic random access memories.

Other objects and advantages of the invention will be apparent to those of ordinary skill in the art having reference to the following specification, together with the drawings.

SUMMARY OF THE INVENTION

A method of reducing gated diode leakage in trench capacitor type field plate isolated dynamic random access memory devices is disclosed. Trenches are etched into a face of a body of semiconductor material. Storage nodes surrounding the trenches are created. A polysilicon layer is formed on the trench walls. A storage dielectric layer is formed on the trench walls, adjacent to the layer of polysilicon on the trench walls, so that the layer of polysilicon on the trench walls lies between the storage dielectric layer and the storage node. The layer of polysilicon on the trench walls reduces leakage current from the storage node. A trench type field plate isolated random access memory cell structure is also disclosed.

An alternative method and an alternative embodiment of a trench type field plate isolated random access memory cell structure is also disclosed. In the alternative method and alternative embodiment, an in-situ doped polysilicon layer on the trench sidewalls functions as the storage node for the memory device. The above described storage node surrounding the trenches is eliminated.

BRIEF DESCRIPTION OF THE DRAWINGS

FIG. 4a is a cross sectional view of a portion of a memory array of a DRAM similar to that of FIGS. 2 and 4 containing an alternative embodiment of the invention.

FIGS. 5a-5c, 5c1, 5d, 5d1, 5e and 5e1 are cross sectional views of the of the trench capacitors 16a and 16b corresponding to FIG. 4 illustrating successive stages in the manufacture thereof.

DETAILED DESCRIPTION OF THE PREFERRED EMBODIMENT

Figure 1:
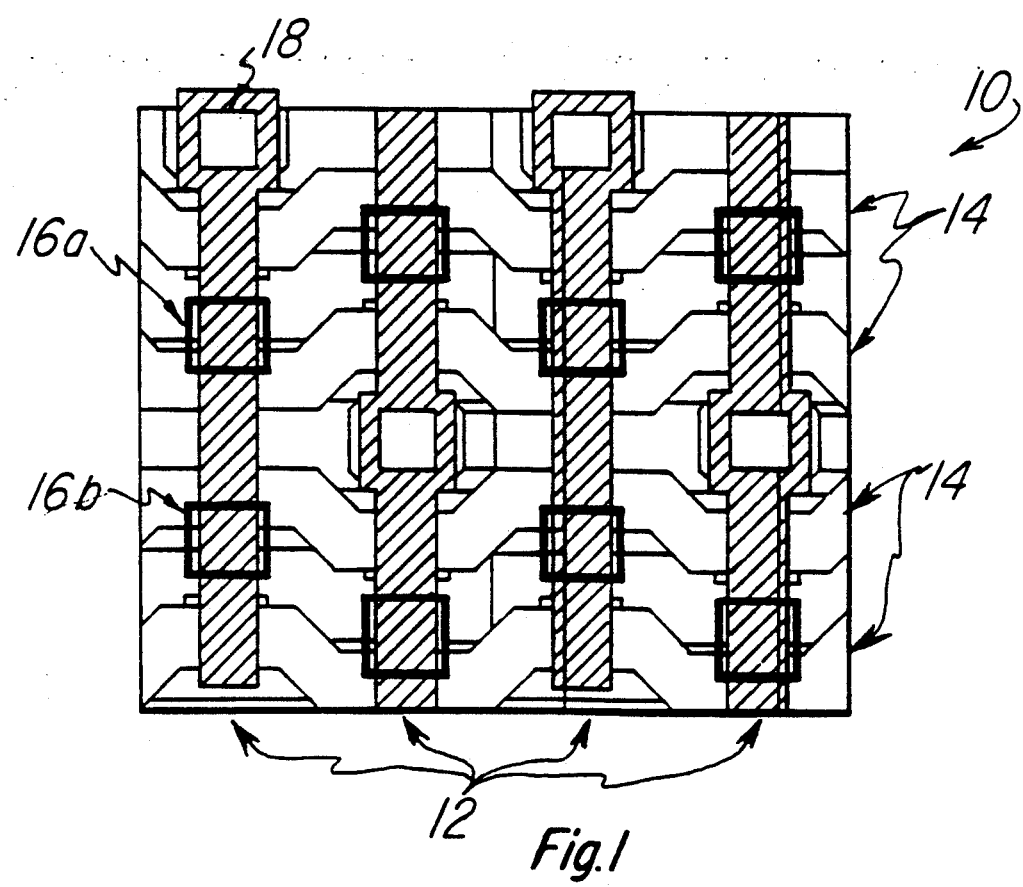
FIG. 1 is a top view of a portion of the memory array of a dynamic random access memory device, DRAM.

FIG. 1 illustrates a top view of a portion of a DRAM 10 memory array. The DRAM 10 may be a VLSI memory device of the so called 16 megabit size containing more than sixteen million memory cells on a single semiconductor substrate. The device contains bit lines 12 of poly-3 ($TiSi_2$) polycide, triple twisted for noise immunity. The word lines 14 are segmented poly-2, are strapped every 64 bits with metal-2. The DRAM 10 lays out the bit lines 12 and the word lines 14 in about a 1.6 um bit line pitch by about a 3.0 um double word line pitch pattern. The trench capacitors 16a and 16b contain a trench opening of about 0.8 um by 0.8 um, a trench to trench space of about 1.1 um, and a trench depth of about 6.0 um. The bit line contact 18 connects to a bit line 12 and to the drain of an unillustrated pass gate transistor 20.

Figure 2:
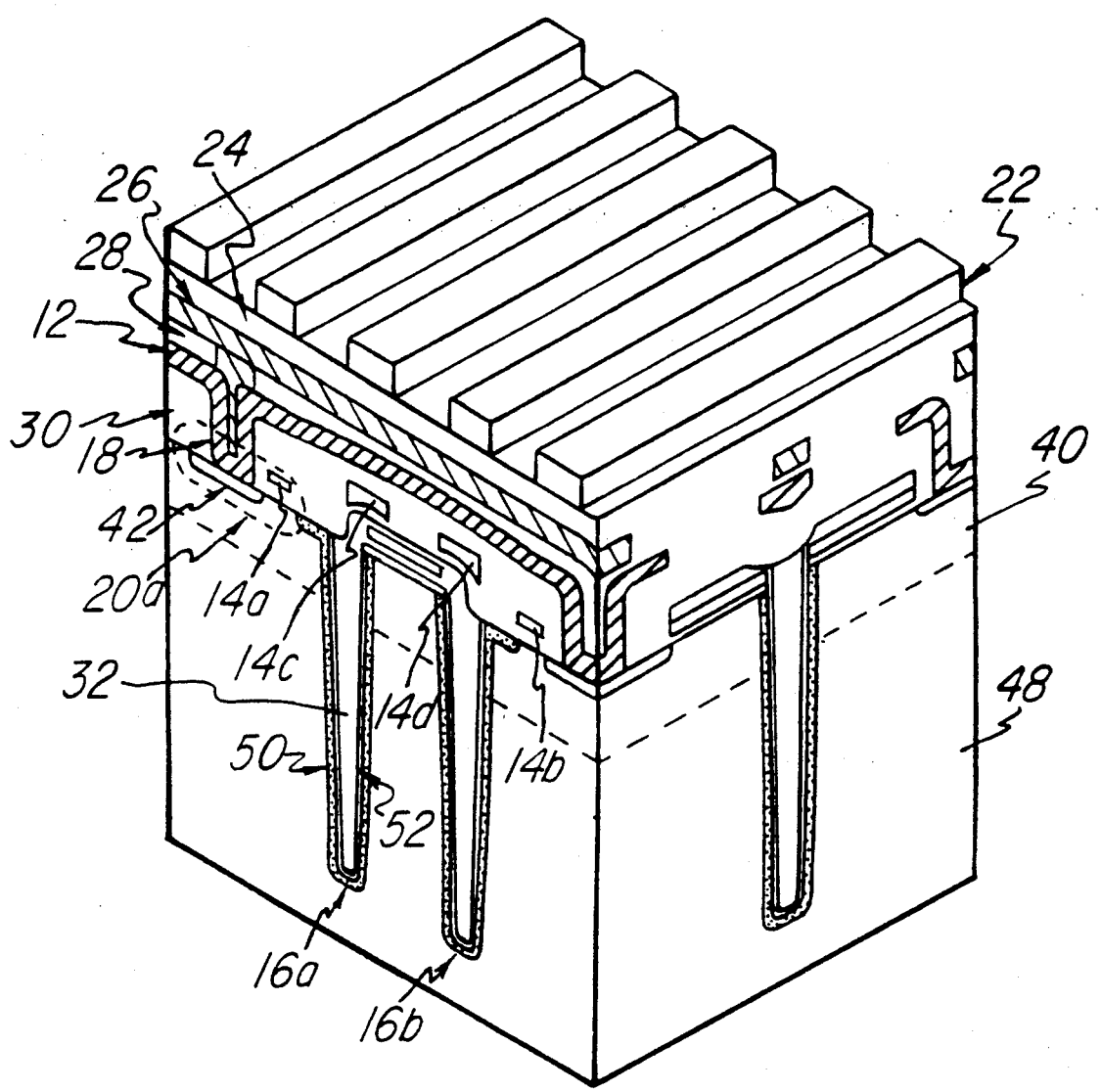
FIG. 2 is a three dimensional perspective view of a portion of the memory array of the DRAM of FIG. 1 containing the trench capacitors 16a and 16b.
Figure 3:
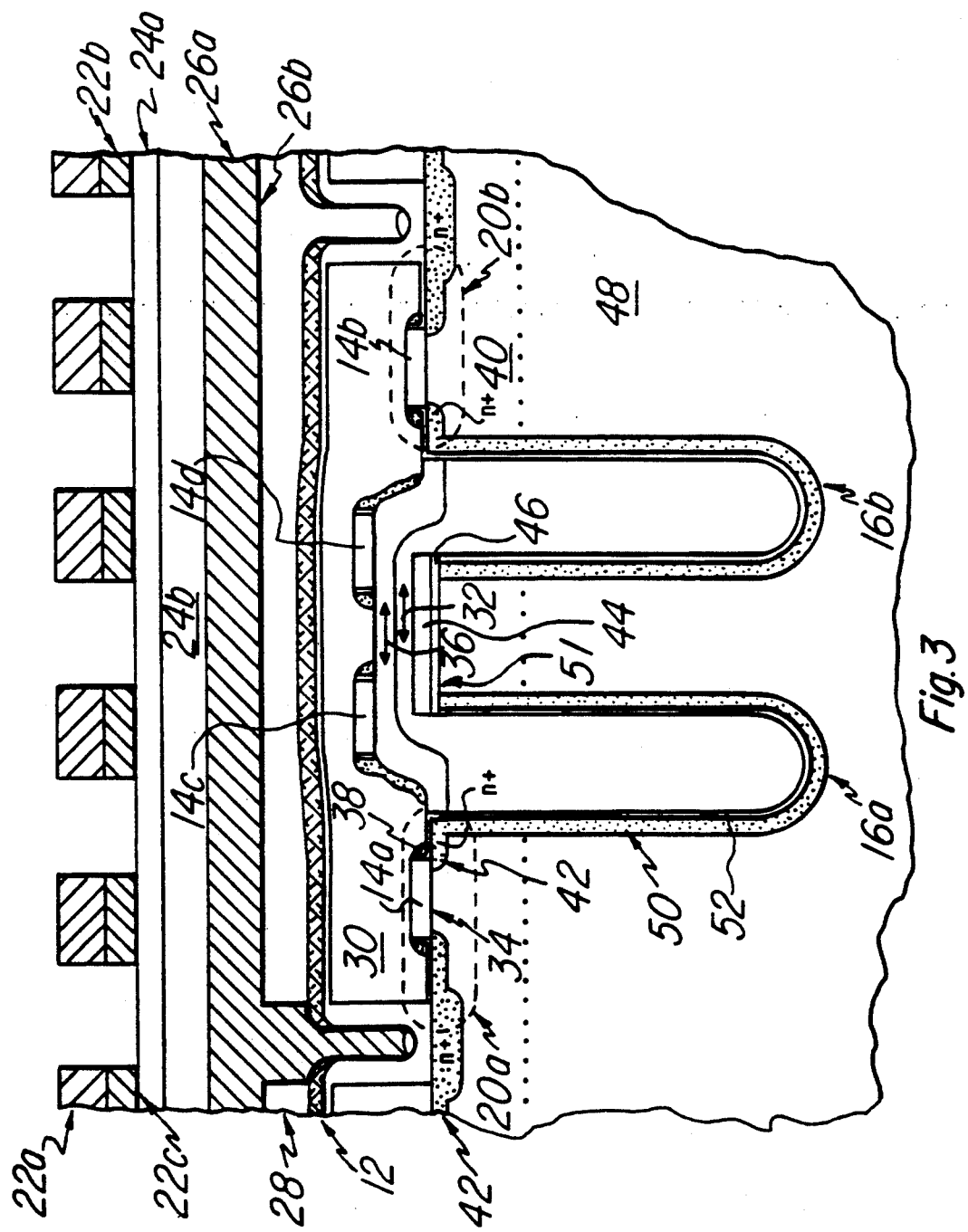
FIG. 3 is a cross sectional view of a portion of the memory array of the DRAM of FIG. 2 containing the trench capacitors 16a and 16b.

FIG. 2 presents a three dimensional view of a portion of FIG. 1 while FIG. 3 presents a cross section view. A three layer interconnect metal 22, Metal-2, accomplishes word line strapping. It has a top level 22a of Al-Si-Cu sputtered onto a middle level 22b of CVD W about 3500 A thick that overlies the bottom level 22C of sputtered TiW about 500 A thick. Oxide layer 24, lying beneath metal-2, is a metal interlevel oxide, MILO, of three layers: a top MILO level 24a of PECVD TEOS oxide about 3500 A thick; a middle level, unillustrated, of spin on glass, SOG; and, a lower MILO level 24b of PECVD TEOS oxide about 7000 A thick. A two level interconnect metal 26, Metal-1, lying beneath MILO-2 24 accomplishes contacts to bit lines. It's top layer 26a of chemical vapor deposited tungsten, CVD W, overlies it's bottom layer 26b of sputtered TiW. A multilevel oxide layer 28, MLO, lies below interconnect metal 26 to provide isolation between the silicided Poly-3 bitlines and Metal-1. A bit line oxide layer 30, BLO, lies beneath bit line 18, between bit line 18 and Poly-2 word lines 14. The poly-2 word lines 14 are about 0.6 microns wide.

Poly-2 word line 14a forms the gate of pass transistor 20a and poly-2 word line 14b forms the gate of the pass transistor 20b for trench capacitor 16b. They are separated from the substrate by a Gate-2 oxide layer 34 about 150 A thick. Poly-2 word lines 14c and 14d pass over the top trench capacitors 16a and 16b and connect to other trench capacitors not shown. They are separated from the Poly-1 field plate 32 by an interlevel oxide layer 36, ILO, of thermally grown oxide. The poly-2 word lines 14 have side walls 38 of deposited nitride-2. Phosphorus N+ implant layer lies in the P tank 40, located underneath the BLO layer 30 of the bit line contacts, and also located between word line 14a of trench capacitor 16a and between word line 14b of trench capacitor 16b. Phosphorous N+ implant layer 42 forms the drain and source of the pass transistors. Underneath the poly-1 field plate 32, between the trench to trench space separating trench capacitors 16a and 16b, lies a nitride layer 44, nitride-3, about 1300 A thick. Between Nitride-3 layer 44 and P-tank 40 lies an oxide layer 46, pad ox-3, containing about 300 A of oxide. It acts as a buffer layer between the Silicon substrate 48 and the nitride-3 layer 44 and as part of the field plate isolating dielectric.

Still referring to FIGS. 2 and 3, the trench capacitors 16a and 16b extend through the P-tank 40 into the P substrate 48 of the silicon wafer, not shown. On the outside of the trench capacitor walls, is an implanted layer 50 of arsenic. Arsenic layer 50 creates the N+ storage node of the trench capacitors. The upper portion of the storage node on the top of the trench edge where the gated diode leakage current could flow into the P-tank 40 is indicated by reference numeral 51. The trench capacitor walls contain a gate dielectric layer 52, gate ox-1, that acts as a dielectric between the arsenic trench wall implant and the poly-1 field plate 32. Gate dielectric layer 52 has a thin layer of nitride covered by a layer of oxide.

Figure 4:
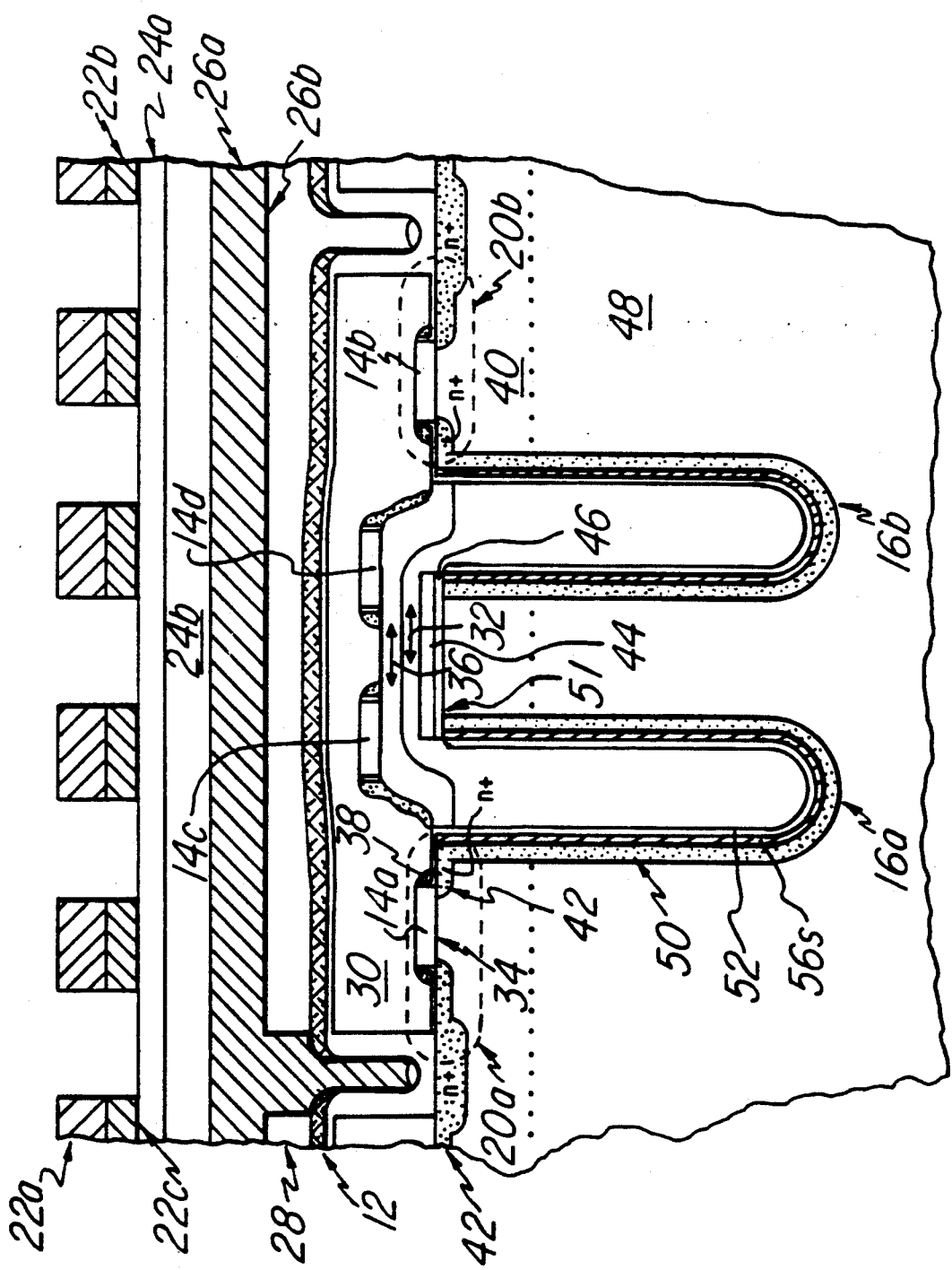
FIG. 4 is a cross sectional view of a portion of a memory array of a DRAM similar to that of FIG. 2 containing the preferred embodiment of the invention.

FIG. 4 presents a cross section view of a DRAM trench capacitor cell containing the preferred embodiment of the invention. The resulting structure is similar to that illustrated in FIG. 3; however, the trench capacitor cells contain trench sidewalls 56s of doped polysilicon. The trench sidewalls 56s lie inside the trenches, on the trench walls, adjacent to the implanted layer 50 of arsenic that forms the N+ storage node of the trench capacitors. Gate dielectric layer 52 overlies the polysilicon trench sidewalls 56s. The polysilicon trench sidewalls 56s are about 500 angstroms thick. Because gate dielectric layer 52 is on sidewalls 56s, there is no gated diode structure in area 51 and therefore leakage current due to the gated diode is eliminated.

FIG. 4a presents a cross section view of a DRAM trench capacitor cell containing an alternative embodiment of the invention. The resulting structure is similar to that illustrated in FIGS. 3 and 4; however, by forming sidewalls 56s of arsenic in-situ doped polysilicon or phosphorus in-situ doped polysilicon, the implanted layer 50 of arsenic is not needed. The arsenic in-situ doped or phosphorus in-situ doped polysilicon sidewalls function as the storage nodes of the trench capacitors.

By reference to FIGS. 5-5e1, this specification next describes the process for manufacturing the preferred embodiment of the above described DRAM 10 of FIG. 4 through the processing point that advantageously eliminates the gated diode leakage problem. U.S. Pat. No. 4,721,987 to Baglee et al. entitled "Trench Capacitor Process for High Density Dynamic Ram" issued Jan. 26, 1988 and assigned to Texas Instruments Incorporated describes an entire DRAM trench capacitor, field plate isolated, process flow and the following copending and coassigned applications of Texas Instruments Incorporated filed on Jul. 25, 1989, incorporated herein by reference, also fully describe process flows suitable for thereafter completing the manufacture of DRAMs having trench capacitors and field plate isolation similar to DRAM 10:

Ser. No. 386,441
Ser. No. 385,601
Ser. No. 385,328
Ser. No. 385,344; and
Ser. No. 385,340.

Referring to FIG. 5, a boron implant step creates P-tank 40 in P type silicon substrate 48. An implant step of about 6.0E12/cm$^2$ boron @50 KeV suffices to increase the boron concentration in p-tank 40 for control of trench capacitance leakage and latchup. A steam/HCL oxidation step at about 900 C. grows about 300 A of oxide on top of p-tank 40 to form pad oxide-3 layer 46. Pad oxide-3 layer 46 acts as a buffer between the silicon substrate 48 and nitride-3 layer 44. A deposition step of about 1DCS: 10NH$_3$, 200 mtorr, 800 C forms nitride-3 layer 44 to a thickness of about 1300 A on top of pad oxide-3 layer 46.

In FIG. 5a, a Phospho-Silicate Glass (PSG) deposition step of about 7.4 wt % phosphorus at 530 C creates a trench mask oxide 54 on top of nitride-3 layer 44. A trench pattern step of coating trench mask oxide layer 54 with photoresist 58, exposing and developing the photoresist 58 through the desired trench pattern next occurs.

FIG. 5b illustrates the resulting structure after a trench mask etch step and a trench etch step. The trench mask etch step etches the trench pattern of about 0.8 um by 0.8 um through PSG mask oxide layer 54, nitride-3 layer 44, and pad oxide-3 layer 46 by 100% overetch of CHF$_3$/CF$_4$/He/Ar at about 900 mtorr. A trench etch step etches the trenches of about 6.0 um through P-tank 40 into P type silicon substrate 48 by RIE of SiF$_4$/HBr, at about 100 mtorr.

FIG. 5c shows the resulting structure after a trench mask strip step and a trench arsenic implant step while FIG. 5c1 presents an enlarged view of the upper portion 51 of the trench wall edge following these steps. The trench mask strip step removes the PSG mask oxide layer 54 and trench wall oxide deposits by deglazing in 10% HF for about 50 seconds followed by a megasonic clean. The HF deglaze step to remove the PSG mask oxide layer 54 also etches into the pad-oxide 3 layer 46 below the nitride-3 layer 44 creating an undercut area 46u around the top of the trench. The edge of nitride layer 44 now "dips-out" over the edge of the pad oxide layer 46. Storage node 50 is created by implanting arsenic into the trench walls. A 6 degree angle tilt implantation of approximately 4.0E15cm/$^2$ arsenci occurring over four 90 degree rotations of 1.0E15/cm$^2$ arsenic @100 KeV is sufficient.

In the advantageous method of the preferred embodiment of the invention, a polysilicon layer 56 is formed by deposition. FIG. 5d presents a cross section view and FIG. 5d1 presents an enlarged view of the corner of trench 16a following this step. About 500 angstroms of in-situ phosphorus doped polysilicon is deposited onto the walls of the trenches utilizing low pressure chemical vapor deposition, LPCVD, techniques. SiH$_4$/TBP or another dopoant gas at about 400 mtorr, 560 degrees centigrade is sufficient to deposit in-situ doped polysilicon 56 into the undercut area 46u and fills undercut area 46u with polysilicon 56. This deposition step also covers the pad oxide-3 layer 46 and the overlying nitride-3 layer 44 with polysilicon 56.

The trenches are masked with a resist so that the resist covers the polysilicon 56s on the trench sidewalls. The resist is exposed and developed. The polysilicon 56 on nitride-3 layer 44 is next stripped away from the memory array except for the trench sidewall polysilicon layers 56s. An anisotropic dry etch works well to remove the polysilicon 56s. The resulting structure is illustrated in FIG. 5e and an enlarged view of trench corner 16a is illustrated in FIG. 5e1.

Referring back to FIG. 4, the device is further processed to yield the dynamic memory cell disclosed therein. A protective coating is added on top, (not shown) and patterned to expose bonding pads. Then the semiconductor wafer is tested, scribed and broken into individual dies, and the dies mounted in semiconductor packages.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of making trench type field plate isolated dynamic random access memory cells, comprising the steps of:

applying and developing a resist to a face of a body of semiconductor material to create mask oxide a trench pattern;

etching trenches into the face of the body of semiconductor material according to the trench pattern, the trenches having top portions near the face of the semiconductor body and sidewalls extending into the semiconductor body;

removing the mask oxide, the mask oxide removing creating an undercut area into the body of semiconductor material near the top of the trenches;

forming storage nodes in the body of semiconductor material surrounding the trenches;

forming polysilicon sidewalls onto the trench sidewalls, the polysilicon sidewalls extending into the undercut area near the top of the trenches;

forming storage dielectric layers on the trench sidewalls, overlying the polysilicon sidewalls; and forming a field plate in the trenches.

2. The method of claim 1 wherein the polysilicon sidewalls are in situ doped polysilicon.

3. The method of claim 2 wherein the polysilicon sidewalls are about 500 angstroms thick.

4. The method of claim 2 wherein the storage nodes are formed by arsenic implantation.

5. The method of claim 4 wherein the storage dielectric layer is formed by the steps of:

depositing a layer of nitride onto the polysilicon sidewalls; and growing a layer of oxide on the deposited layer of nitride.

6. A method of making trench type field plate isolated dynamic random access memory cells, comprising the steps of:

applying and developing a resist to a face of a body of semiconductor material to create a mask oxide trench pattern;

etching trenches into the face of the body of semiconductor material according to the trench pattern, the trenches having top portions near the face of the semiconductor body and sidewalls extending into the semiconductor body;

removing the mask oxide, the mask oxide removing creating an undercut area into the body of semiconductor material near the top of the trenches;

forming polysilicon sidewall storage nodes onto the trench sidewalls, the polysilicon sidewall storage nodes extending into the undercut area near the top of the trenches;

forming storage dielectric layers on the trench sidewalls, overlying the polysilicon sidewall storage nodes; and forming a field plate in the trenches.

7. The method of claim 6 wherein the polysilicon sidewall storage nodes are arsenic in-situ doped.

8. The method of claim 6 wherein the polysilicon sidewall storage nodes are phosphorus in-situ doped.

* * * * *